United States Patent [19]

Ochii

[11] 4,435,793
[45] Mar. 6, 1984

[54] SEMICONDUCTOR MEMORY DEVICE WITH DUMMY WORD LINE/SENSE AMPLIFIER ACTIVATION

[75] Inventor: Kiyofumi Ochii, Yokohama, Japan

[73] Assignee: Tokyo Shibaura Denki Kabushiki Kaisha, Japan

[21] Appl. No.: 373,624

[22] Filed: Apr. 30, 1982

Related U.S. Application Data

[63] Continuation-in-part of Ser. No. 171,264, Jul. 22, 1980, abandoned.

[30] Foreign Application Priority Data

Jul. 26, 1979 [JP] Japan .................................. 54-95527
Jul. 18, 1980 [EP] European Pat. Off. ........ 80104251.6

[51] Int. Cl.³ .......................... G11C 7/00; G11C 8/00
[52] U.S. Cl. .................................. 365/233; 365/190; 365/210
[58] Field of Search ............... 365/190, 194, 195, 210, 365/233

[56] References Cited

U.S. PATENT DOCUMENTS

| | | | |
|---|---|---|---|
| 3,407,392 | 10/1968 | Ishidate | 365/194 |
| 4,094,008 | 6/1978 | Lockwood et al. | 365/210 |
| 4,110,842 | 8/1978 | Sarkissian et al. | 365/233 |
| 4,162,540 | 7/1979 | Ando | 365/190 |
| 4,164,791 | 8/1979 | Hamma | 365/190 |
| 4,231,110 | 10/1980 | Stinehelfer | 365/194 |
| 4,247,791 | 1/1981 | Revell | 365/190 |
| 4,291,394 | 9/1981 | Nakane et al. | 365/210 |
| 4,344,154 | 8/1982 | Klaas et al. | 365/194 |

*Primary Examiner*—Stuart N. Hecker
*Attorney, Agent, or Firm*—Finnegan, Henderson, Farabow, Garrett & Dunner

[57] ABSTRACT

A semiconductor memory device is provided, including a plurality of MOS memory cells arranged in a matrix fashion, word lines for selectively transferring an access signal to the MOS memory cells, plural pairs of data lines for effecting data transfer with resepct to the MOS memory cells, sense amplifiers connected to the plural pairs of data lines to amplify data signals on the data lines, and a clock pulse generator connected to produce a clock pulse for activating the sense amplifiers. The memory device further includes a dummy word line arranged in the same manner as the word lines, and a dummy decoder connected to energize the clock pulse generator through the dummy word line so that the clock pulse generator produces a clock pulse to activate the sense amplifiers for preset period of time.

27 Claims, 24 Drawing Figures

FIG. 6
FIG. 7
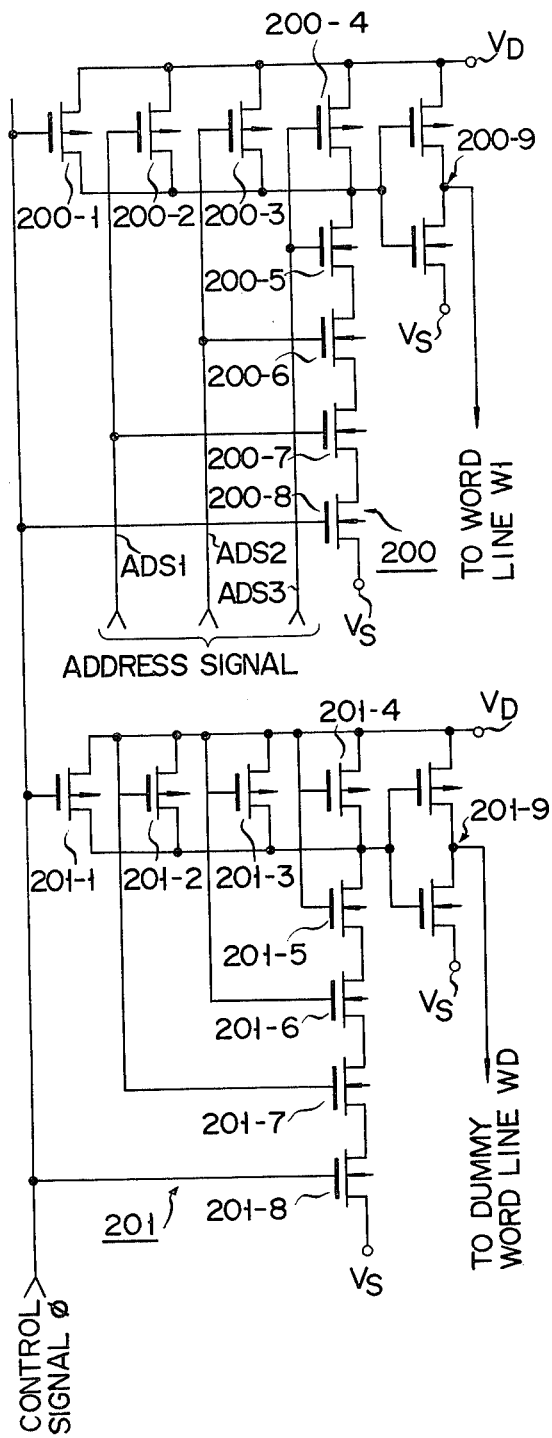
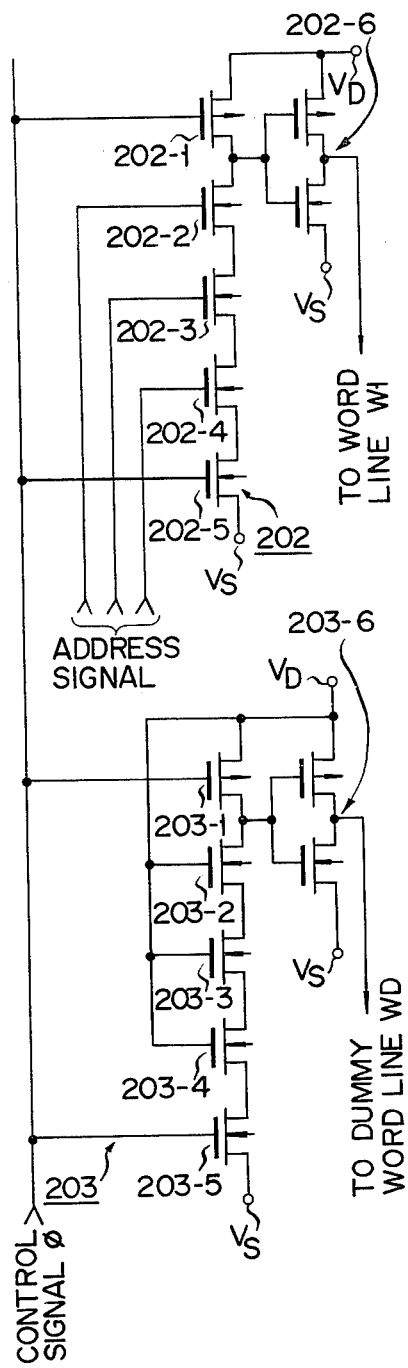

FIG. 9A  READOUT CYCLE

FIG. 10A  WRITE CYCLE

SEMICONDUCTOR MEMORY DEVICE WITH DUMMY WORD LINE/SENSE AMPLIFIER ACTIVATION

CROSS-REFERENCE TO THE RELATED APPLICATION

This application is a continuation-in-part of application Ser. No. 171,264, filed on July 22, 1980 and now abandoned.

BACKGROUND OF THE INVENTION

This invention relates to semiconductor memory devices.

MOS memories formed of insulated gate field-effect transistors (MOS transistors) are classed into dynamic memories which are advantageous for high density integration and static memories which are comparatively free from timing restrictions and are suited for high speed operation.

With a recent trend for increasing memory capacity, there have been demands for higher integration density and operation speed of memories. Particularly, various methods have been proposed for reducing the data readout time or access time. In practice, there are various considerations given to the address decoder circuit, sense amplifier circuit, input/output circuit, etc., and particularly great importance is attached to the improvement of the sense amplifier.

FIG. 1 shows a semiconductor memory provided with a positive feedback sense amplifier. It comprises a matrix array of memory cells MC-11 to MC-MN, word lines W1 to WN each commonly connected to the memory cells in each row, pairs of data lines D0-1 and D1-1, D0-2 and D1-2, ..., D0-M and D1-M each pair commonly connected to the memory cells in each column, a row decoder 2 connected to the word lines W1 to WN for selecting one of these word lines in response to an address signal from an address signal generator circuit (not shown) and a column decoder 4 connected to the data lines D0-1 to D0-M and D1-1 to D1-M for selecting one of these pairs of data lines. It further comprises a precharging circuit 6, which is connected to the data lines D0-1 to D0-M and D1-1 to D1-M for precharging the pairs of data lines to the same potential level every time when the address designating operation is started or ended, an input/output unit 8 connected through a pair of input/output lines 9-1 and 9-2 to the column decoder 4 and which functions to permit data transfer between the selected one of the memory cells MC-11 to MC-MN and an external circuit (not shown), sense amplifiers SA-1 to SA-M connected to the respective pairs of the data lines and a clock pulse generator 10 for supplying trigger clock pulses to these sense amplifiers SA-1 to SA-M.

In this semiconductor memory circuit, the readout operation is effected as follows. The precharging circuit 6 precharges all the data lines D0-1 to D0-M and D1-1 to D1-M to a predetermined potential level, for instance, at the time of the commencement of the readout operation. Subsequently, the row decoder 2 selects one of the word lines W1 to WN in response to an address signal from the address signal generator circuit (not shown) to permit data in the memory cells connected to the selected word line to be read out. Meanwhile, the column decoder 4 selects a pair of data lines in response to an address signal from the address signal generator circuit. The data read out from the memory cell connected to the selected word and data lines is amplified by the corresponding sense amplifier. At this time, the change of the potential difference between the pair of data lines selected for effecting the transfer of data from the addressed memory is comparatively slow since a parasitic load capacitance which is comparatively heavy with respect to the driving capacity of the memory cell is coupled to the data lines D0-1 to D0-M and D1-1 to D1-M. When a predetermined value is reached by the potential difference between the selected pair of data lines, the corresponding sense amplifier effects positive feedback of the data signal on this pair of data lines, that is, increases the potential difference between the data lines of this pair, in response to a clock pulse from the clock pulse generator 10, whereby the data signal from the addressed memory cell is amplified and transferred through the column decoder 4 and input-/output unit 8 to an external circuit (not shown).

In this case, the timing with which to activate the sense amplifiers SA-1 to SA-M is important. The utmost effect of the positive feedback by the sense amplifier can be obtained if the sense amplifier is activated when a potential difference, to which the sense amplifier can respond, is produced between the pair of data lines. However, if the activation is caused before this timing, erroneous data readout is likely to result, while with the activation after this timing the effect of the positive feedback by the sense amplifier is reduced.

Generally, where the gate electrodes of the MOS transistors constituting the memory cells are formed of polycrystalline silicon, the word lines W are formed of polycrystalline silicon layers, and data lines D0 and D1 are formed of metal layers. This is done so because in the silicon gate type MOS memory metal layers can be used as lead layers perfectly independently of polycrystalline silicon layers, thus providing greater freedom of the wiring, and also because the density of integration can be increased by forming the word lines, which are connected to the gate electrodes of the MOS transistors used for forming the memory cells, of polycrystalline silicon. However, whereas the sheet resistance of the metal layer is sufficiently low, that of the polycrystalline silicon layer is considerably high, of the order of several ten $\Omega/\square$, so that the time required for the charging and discharging through the load capacitance parasitic to the polycrystalline silicon layer greatly differs between a memory cell near the decoder 2 and one remote therefrom; that is, the row address period is longest for the memory cell most distant from the row decoder 2. On the other hand, the data lines D0 and D1 which are formed of the metal layer are held practically at a uniform potential, and the readout time is thus substantially the same for all the memory cells arranged on the same column.

While the propagation time of the row address signal propagating through the word line is an important factor for determining the timing at which to activate the sense amplifiers SA-1 to SA-M, in the semiconductor memory circuit of FIG. 1 the sense amplifiers SA-1 to SA-M are activated according to clock pulses produced from the clock pulse generator 10 independently of the propagation time of the row address signal, so that with variations in the propagation time of the row address signal the proper activation timing cannot be obtained.

In the prior art, it has also been in practice to use direct positive feedback type sense amplifiers which can directly effect positive feedback of data to the pair of data lines in response to the potential difference between the pair of data lines. With these direct positive feedback type sense amplifiers it is possible to obtain the optimum timing with which to activate the sense amplifiers comparatively readily compared to the case of the semiconductor memory circuit of FIG. 1. However, since these sense amplifiers are of the direct positive feedback type, the amplification degree is low compared to that of the sense amplifiers in the semiconductor memory circuit of FIG. 1 when they are activated with the optimum timing.

FIG. 2 shows a different prior art semiconductor memory circuit. It is different from the semiconductor memory circuit of FIG. 1, in which the sense amplifiers SA-1 to SA-M are each connected between the data lines of each pair, only in that a sense amplifier 12 is connected between the pair of input/output lines 9-1 and 9-2.

Again in the semiconductor memory circuit of FIG. 2, the sense amplifier 12 is activated in response to clock pulses from the clock pulse generator 10 without directly monitoring the propagation time of the row address signals transmitted through the word lines W1 to WN, so that with variations in the propagation time of the row address signal the proper activation timing cannot be obtained.

SUMMARY OF THE INVENTION

An object of the invention is to provide a semiconductor memory circuit, which permits the optimum timing of activation of the sense amplifier to be obtained at all times.

According to one mode of the invention, there is provided a semiconductor memory circuit, which comprises a plurality of memory cells, at least one word line coupled to these memory cells for supplying an access signal thereto, at least one data line coupled to the plurality of memory cells for transferring data with respect thereto, a sense amplifier means coupled to the aforementioned at least one data line for positive feedback amplifying data transferred therethrough, a dummy word line having a signal transfer property similar to that of the aforementioned at least one word line, a dummy selection signal generating means coupled to the dummy word line for supplying a dummy selection signal to the dummy word line every time when an address specifying operation is effected, and an energizing signal generating means coupled to the dummy word line for producing an energizing signal for a preset period of time to activate the sense amplifier means in response to a dummy selection signal received through the dummy word line.

BRIEF DESCRIPTION OF THE DRAWINGS

FIGS. 6 and 7 are circuit diagrams showing examples of part of the row decoder and the dummy decoder that can be used for the semiconductor memory device shown in FIG. 3;

FIGS. 9A to 9F show waveforms of signals for illustrating the readout operation of the memory device shown in FIGS. 3 to 8;

FIGS. 10A to 10F show waveforms of signals for illustrating the write-in operation of the memory device shown in FIGS. 3 to 8;

DETAILED DESCRIPTION OF THE PREFERRED EMBODIMENTS

Figure 3:
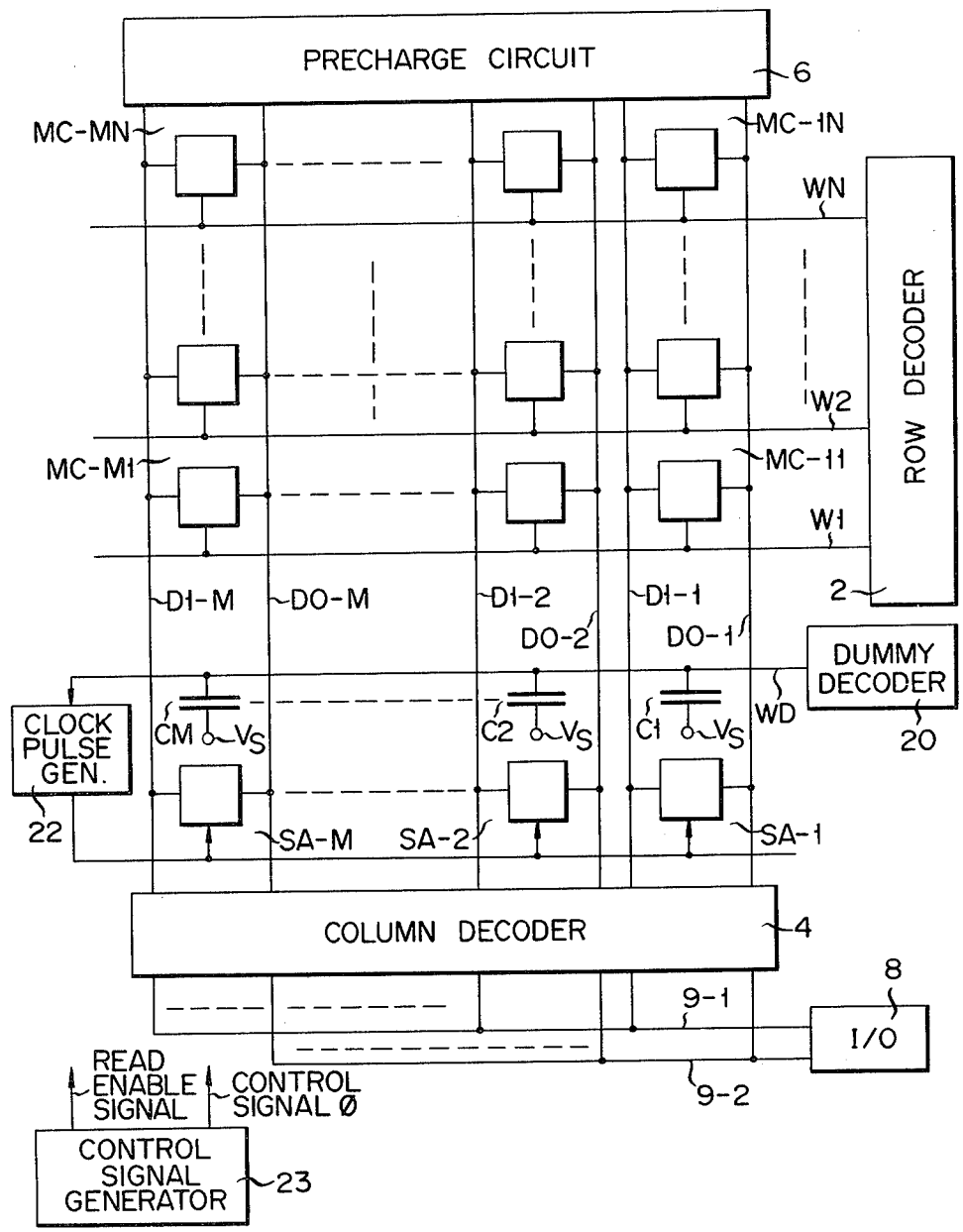
FIG. 3 is a block diagram showing an embodiment of the semiconductor memory device according to the invention.
Figure 4:
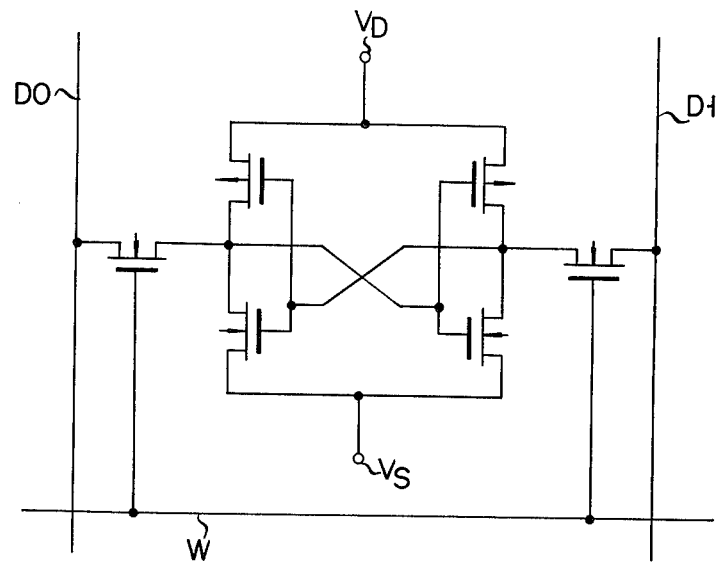
FIGS. 4 and 5 are circuit diagrams showing examples of the MOS memory cell that can be used for the semiconductor memory circuit shown in FIG. 3.
Figure 5:
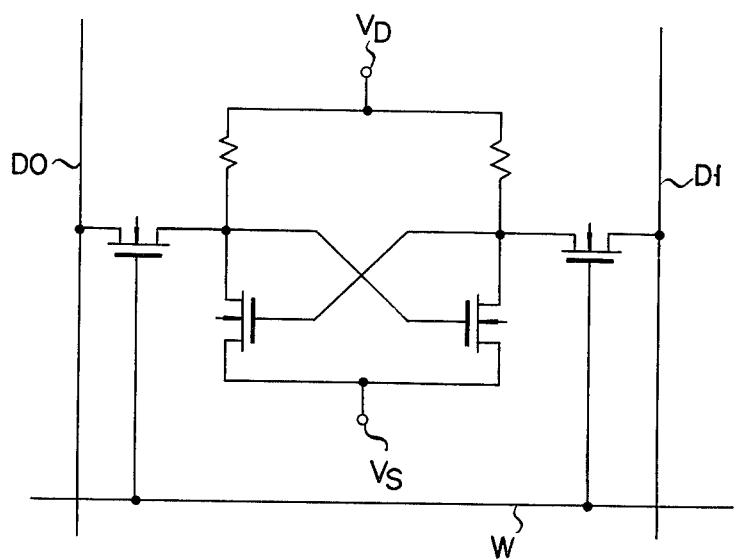

FIG. 3 shows an embodiment of the semiconductor memory device according to the invention. This semiconductor memory circuit, like the one shown in FIG. 1, comprises a matrix array of memory cells MC-11 to MC-MN, word lines W1 to WN each commonly connected to the memory cells in each row, data lines D0-1 to D0-M and D1-1 to D1-M each pair commonly connected to the memory cells in each column, a row decoder 2 for selecting one of the word lines W1 to WN in response to an address signal from an address signal generator circuit (not shown) and a column decoder 4 for selecting one pair of data lines D0-1 to D0-M and D1-1 to D1-M in response to an address signal from the address signal generator circuit. The memory cells MC-11 to MC-MN have a well-known construction, for instance, that of a cross-coupled memory cell as shown in FIG. 4 or that of a resistive load type n-channel MOS memory cell as shown in FIG. 5.

The memory circuit further comprises a precharging circuit 6, which is connected to the data lines D0-1 to D0-M and D1-1 to D1-M and functions to precharge the pairs of data lines to the same potential level every time the address designating operation is started or ended, an input/output unit 8, which is connected through a pair of input/output lines 9-1 and 9-2 to the column decoder 4 and functions to enable data transfer between the selected one of the memory cells MC-11 to MC-MN and an external circuit (not shown) and sense amplifiers SA-1 to SA-M connected to the respective pairs of the data lines.

Figure 1:
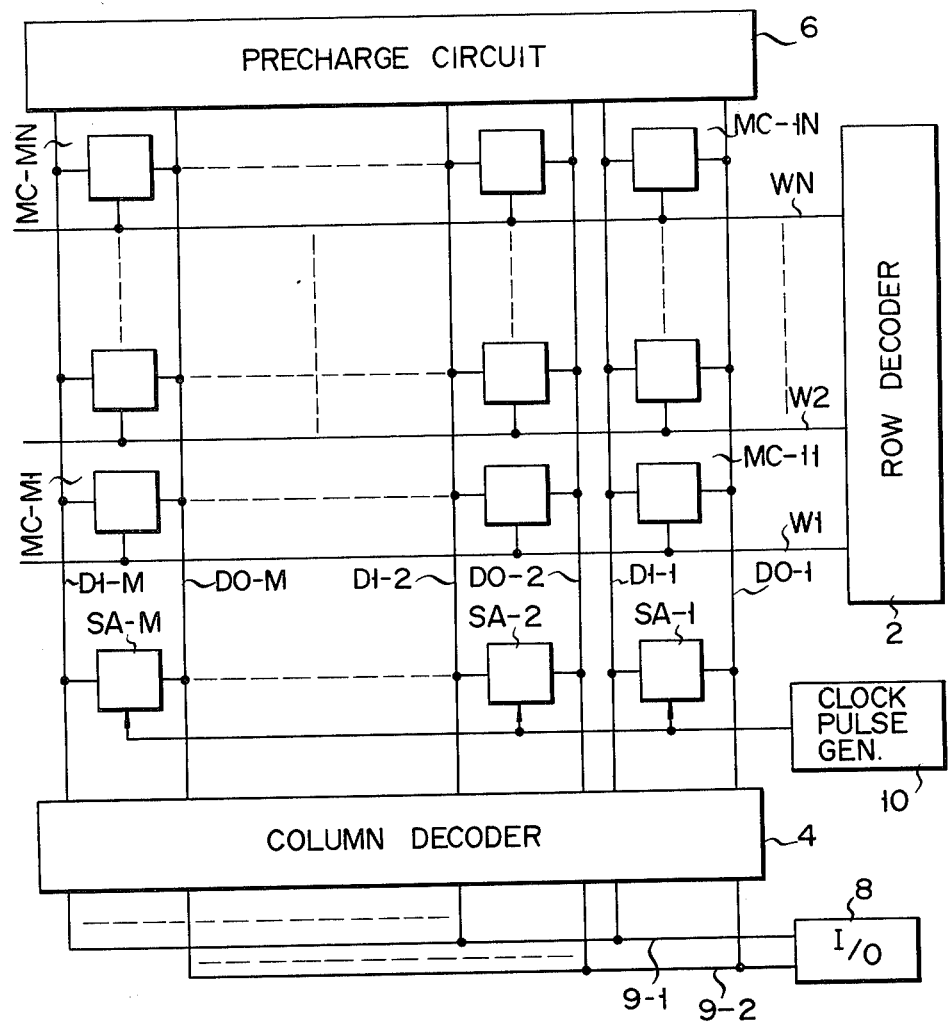
FIGS. 1 and 2 are block diagrams showing prior art semiconductor memory circuit.
Figure 2:
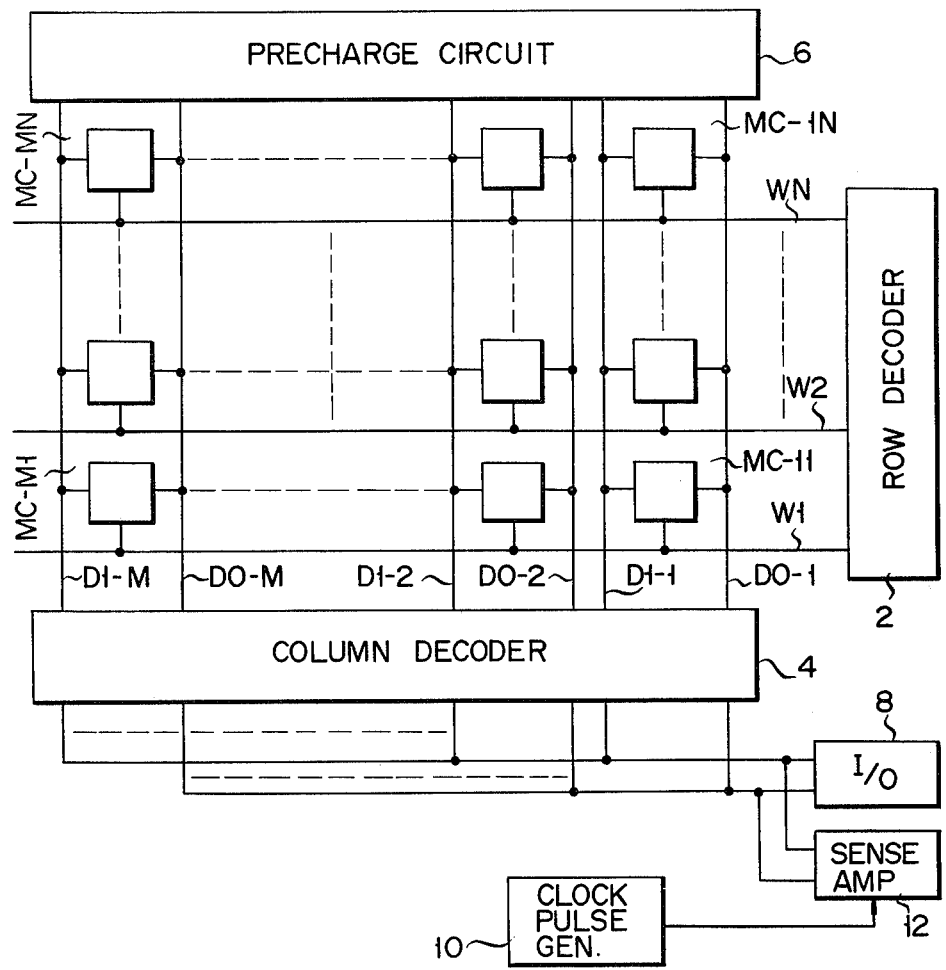

This semiconductor memory circuit in this embodiment, unlike the prior art semiconductor memory circuit shown in FIG. 1, is provided with a dummy decoder 20 for producing a dummy select signal for every address designating operation cycle, a dummy word line WD provided across the data lines D0-1 to D0-M and D1-1 to D1-M to transmit the dummy select signal from the dummy decoder 20, M number of dummy capacitors C1 to CM connected to the dummy word line WD and a clock pulse generator 22 for producing clock pulses for activating the sense amplifiers SA-1 to SA-M in response to the dummy selection signal supplied from the dummy decoder 20 through the dummy word line WD. The dummy word line WD is formed of, for instance, a polycrystalline silicon layer like the word lines W1 to WM. There is further provided a control signal generating circuit 23 which produces a read enable signal and a control signal $\phi$. The read enable signal is set at a high level to effect the readout operation and set a low level for a preset period of time to effect the write-in operation as described later. The control signal $\phi$ is set at a high level after a preset precharging period of time in each operation cycle.

In the embodiment of FIG. 3, the dummy decoder 20 is adapted to energize the dummy word line WD at the same timing as that at which the row decoder 2 selectively energizes one of the word lines W1 to WM at the time of the address designating operation. It may have substantially the same construction as each decoder section of the row decoder 2, for instance as shown in FIG. 6. As shown in FIG. 6, a row decoder section 200 for energizing the word line W1 comprises a p-channel MOS transistor 200-1, which receives at its gate a control signal $\phi$ supplied from the control signal generating circuit 23 and showing a high level after a precharge period during the readout period and has its source connected to a power supply terminal $V_D$, p-channel MOS transistors 200-2 to 200-4, which each have their current paths connected in parallel with that of the MOS transistor 200-1 and their gates connected to respective address signal lines ADS1 to ADS3, n-channel MOS transistors 200-5 to 200-8, which each have their current paths connected in series with that of the MOS transistor 200-4 between the power supply terminals $V_D$ and $V_S$ and their gates respectively connected to the gates of the MOS transistors 200-4, 200-3, 200-2 and 200-1, and a CMOS inverter 200-9 having an input terminal connected to the juncture between the MOS transistors 200-4 and 200-5 and an output terminal connected to the word line W1. Likewise, a dummy decoder 201 comprises a MOS transistor 201-1, which receives the control signal $\phi$ at its gate and has its source connected to the power supply terminal $V_D$, p-channel MOS transistors 201-2 to 201-4, which each have their current paths connected in parallel with that of the MOS transistor 201-1, n-channel MOS transistors 201-5 to 201-8, which have their current paths connected in series with that of the MOS transistor 201-4 and their gates respectively connected to the gates of the MOS transistors 201-4, 201-3, 201-2 and 201-1, and a CMOS inverter 201-9 having an input terminal connected to the juncture between the MOS transistors 201-4 and 201-5 and an output terminal connected to the dummy word line WD. As is apparent from FIG. 6, the dummy decoder 201 is practically the same as the row decoder section 200 except that in the former the gates of the MOS transistors 201-2 to 201-4 are not connected to the address signal lines.

It is of course to be understood that in a row decoder section for energizing a different word line from the word line W1 an inverter is coupled to at least one of the address signal lines ADS1 to ADS3. Also, while in this example three address signal lines are used, it is possible to use a different number of address signal lines as well.

At the time of the start of the readout operation, the data lines D0 and D1 are both precharged to a predetermined potential level by the precharging circuit 6 (FIG. 3), while at the same time an address signal from the address signal generator circuit (not shown) is supplied to the address signal lines ADS1 to ADS3. If the address signal supplied is one for energizing the word line W1, the MOS transistors 200-2 to 200-4 are rendered non-conductive while the MOS transistors 200-5 to 200-7 are rendered conductive at this time. When the control signal $\phi$ is subsequently produced from the control signal generating circuit 23, the MOS transistor 200-1 is rendered non-conductive while the MOS transistor 200-8 is rendered conductive. As a result, the input signal to the CMOS inverter 200-9 is inverted to a low level, so that a high level output signal is produced from the inverter 200-9 to energize the word line W1. Meanwhile, in the dummy decoder 201 the MOS transistors 201-2 to 201-4 are normally held non-conductive while the MOS transistors 201-5 to 201-7 are held conductive. When the control signal $\phi$ is received by the dummy decoder 201 in this state, the MOS transistor 201-1 is rendered non-conductive while the MOS transistor 201-8 is rendered conductive. As a result, the input signal to the CMOS inverter 201-9 is inverted to a low level, so that a high level output signal is produced from the inverter to energize the dummy word line WD.

It is to be understood that immediately before the control signal $\phi$ is supplied after the supply of the address signal, the row decoder section 200 and dummy decoder 201 are set in substantially the same state, so that the word lines W1 and WD are energized an equal period of time after the supply of the control signal $\phi$.

FIG. 7 shows a different row decoder section 202 for selectively energizing the word line W1 and a dummy decoder 203 for energizing the dummy word line WD. The row decoder section 202 comprises a p-channel MOS transistor 202-1, which receives the control signal $\phi$ at its gate and has its source connected to a power supply terminal $V_D$, n-channel MOS transistors 202-2 to 202-5, which are connected in series with the MOS transistor 202-1 between power supply terminals $V_D$ and $V_S$, with the MOS transistors 202-2 to 202-4 having their gates connected to respective address signal lines ADS4 to ADS6, and a CMOS inverter 202-6 having an input terminal connected to the juncture between the MOS transistors 202-1 and 202-2 and an output terminal connected to the word line WD. The dummy decoder 203 comprises a p-channel MOS transistor 203-1, which receives the control signal $\phi$ at its gate and its source connected to the power supply terminal $V_D$, n-channel MOS transistors 203-2 to 203-5, which are connected in series with the MOS transistor 203-1 between the power supply terminals $V_D$ and $V_S$, with the MOS transistors 202-2 to 202-4 having their gates connected to the power supply terminal $V_D$, and a CMOS inverter 203-6 having an input terminal connected to the junction between the MOS transistors 203-1 and 203-2 and an output terminal connected to the dummy word line WD.

The dummy decoder 203 shown in FIG. 7, again energizes the dummy word line WD in response to the control signal $\phi$ at the same time as that at which the row decoder section 202 energizes the word line W1. In other words, in the semiconductor memory circuit shown in FIG. 3 the dummy selection signal is supplied from the dummy decoder 20 to the dummy word line simultaneously with the supply of the row selection signal from the row decoder 20 to one of word lines W1 to WN.

Figure 8:
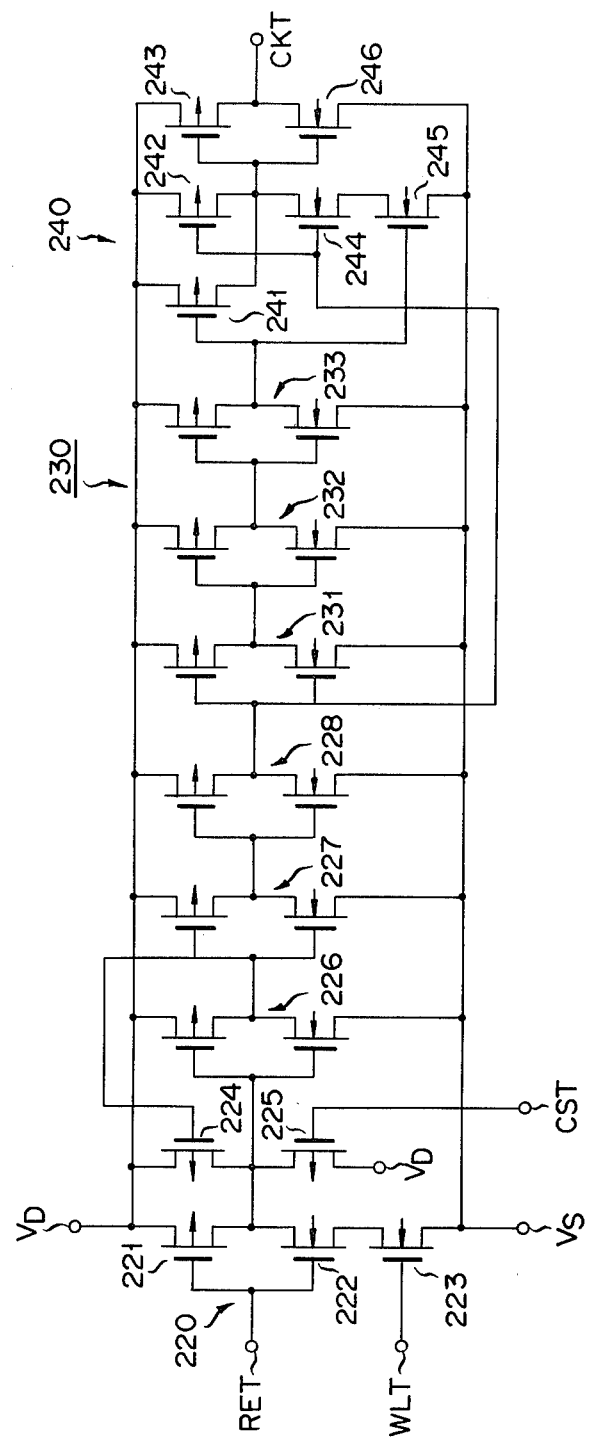
FIG. 8 is a circuit diagram showing an example of the clock pulse generator used for the semiconductor memory device shown in FIG. 3.

FIG. 8 shows a specific construction of the clock pulse generator 22. It comprises a CMOS inverter 220 including p- and n-channel MOS transistors 221 and 222, an n-channel MOS transistor 223 connected in series with the n-channel MOS transistor 222, p-channel MOS transistors 224 and 225 each having a source connected to a power supply terminal $V_D$ and a drain connected to an output terminal of the CMOS inverter 220, a CMOS inverter 226 having an input terminal connected to the drain of the MOS transistors 224 and 225, a CMOS inverter 227 having an input terminal connected to an output terminal of the CMOS inverter 226, and a CMOS inverter 228 having an input terminal connected to an output terminal of the CMOS inverter 227. The CMOS inverter 220 has its input terminal connected to a readout enable terminal RET, the MOS transistor 223 has its gate connected to a word line terminal WLT connected to the dummy word line WD, the MOS transistor 224 has its gate connected to the input terminal of the CMOS inverter 226, and the MOS transistor 225 has its gate connected to a control signal input terminal CST.

The output terminal of the CMOS inverter 228 is connected to an input terminal of an inversion type delay circuit 230 formed of three CMOS inverters 231 to 233 which are serially connected and each include p- and n-channel MOS transistors. The output terminal of the delay circuit 230 is connected to one input terminal of an AND gate circuit 240 having the other input terminal connected to the output terminal of the CMOS inverter 228. The AND gate circuit 240 includes p-channel MOS transistors 241 to 243 whose sources are connected to the power supply terminal $V_D$, n-channel MOS transistors 244 and 245 whose current paths are serially connected between the drain of the MOS transistor 242 and the power supply terminal $V_S$, and an n-channel MOS transistor 246 whose current path is connected between the drain of the MOS transistor 243 and the power supply terminal $V_S$. The gates of the MOS transistors 241 and 245 are connected to the output terminal of the delay circuit 230, the gates of the MOS transistors 242 and 244 are connected to the output terminal of the CMOS inverter 228, and the gates of the MOS transistors 243 and 246 are connected to the drain of the MOS transistor 241 and to a junction between the MOS transistors 242 and 244. A junction between the MOS transistors 243 and 246 is connected to a clock output terminal CKT which is connected to the sense amplifiers SA-1 to SA-M.

Figure 9B:
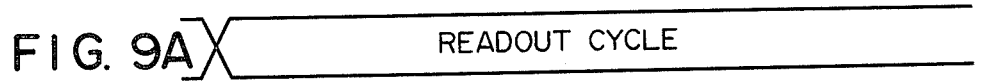
Figure 9B:
Figure 9C:
Figure 9D:
Figure 9E:
Figure 9F:

In the clock pulse generator 22 shown in FIG. 8, with the commencement of the readout operation as shown in FIG. 9A, the MOS transistors 221 and 222 are respectively rendered non-conductive and conductive in response to a read enable signal having a high level and applied to the read enable terminal RET. At this time, the data lines D0 and D1 are precharged to a preset potential level as shown in FIGS. 9B and 9C, for example. Subsequently, when the precharge period is elapsed, the MOS transistor 225 is rendered non-conductive by the control signal $\phi$ shown in FIG. 9D. A predetermined period of time after the impression of the control signal $\phi$ upon the gate of the MOS transistor 225, the dummy selection signal shown in FIG. 9E which is generated from the dummy decoder 20 reaches a predetermined level to render the MOS transistor 223 conductive. As a result, a low level signal is supplied to the CMOS inverter 226, so that the CMOS inverter 226 produces a high level output signal to render the MOS transistor 224 nonconductive. The high level signal from the CMOS inverter 226 is supplied after inversion through the CMOS inverter 227 to the CMOS inverter 228, so that the CMOS inverter 228 produces a high level output signal. The high level output signal from the CMOS inverter 228 is directly supplied to one input terminal of the AND gate circuit 240 and at the same time to the other input terminal of the AND gate circuit 240 through the inversion type delay circuit 230. As a result, the clock pulse generator 22 produces an output signal having a high level during the time corresponding to the delay time of the inversion type delay circuit 230. The high level output signal from the clock pulse generator 22 is supplied to the sense amplifiers SA-1 to SA-M to activate the sense amplifiers.

Figure 10B:
Figure 10B:
Figure 10C:
Figure 10D:
Figure 10E:
Figure 10F:

In a case where the write-in operation is started as shown in FIG. 10A, a high level read enable signal is applied to the read enable terminal RET, and therefore the same operation as described with reference to FIGS. 9A to 9E is effected. After the potentials on the data lines D0 and D1 are set at levels corresponding to the data stored in a memory cell into which new data is written, the read enable signal is made low as shown in FIG. 10B to set up a write-in mode. In response to the read enable signal of low level, the potentials on the data lines D0 and D1 are set at levels corresponding to new data to be written. In this example, the potential on the data line D0 is changed over from a low level to a high level as shown in FIG. 10C, and the potential on the data line D1 is changed over from a high level to a low level as shown in FIG. 10D. The period of time of the write-in mode setting signal or the low level period of time of the read enable signal may be so determined that the read enable signal will rise immediately after the potential levels of the data lines D0 and D1 become equal to each other in the example shown in FIGS. 10C and 10D. When the read enable signal becomes high, the clock pulse generator 22 produces, as shown in FIG. 10F, an output signal having a high level during the time corresponding to the delay time of the inversion type delay circuit 230. That is, the clock pulse generator 22 produces a high level output signal in response to the trailing edge of the write-in mode setting signal. The high level output signal from the clock pulse generator 22 is supplied to the sense amplifiers SA-1 to SA-M to activate the same. A corresponding one of the sense amplifiers SA-1 to SA-M amplifies the potentials on the corresponding data lines D0 and D1 so that the potentials on the data lines D0 and D1 are quickly rise and fall as shown in FIGS. 10C and 10D, respectively. Thus, write-in operation can be effected in a short period of time. FIG. 10E shows a dummy selection signal corresponding to that shown in FIG. 9D.

Figure 11:
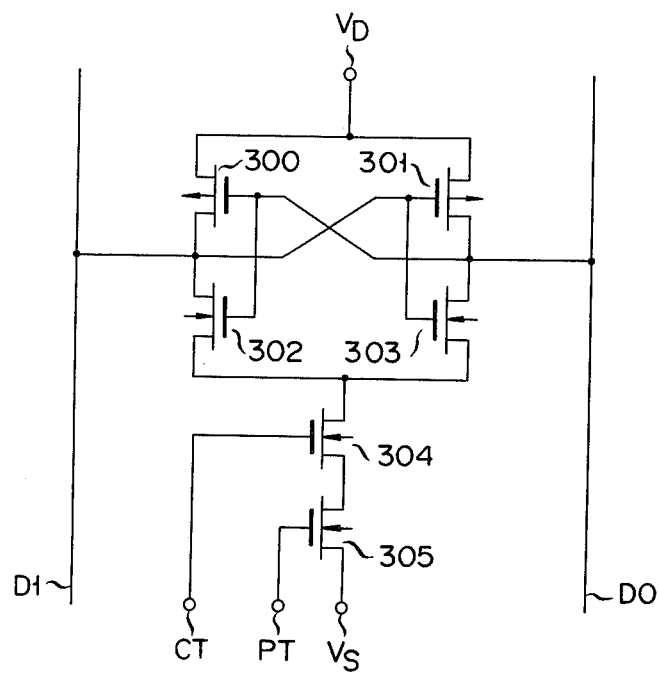
FIG. 11 is a circuit diagram showing an example of the sense amplifier used for the semiconductor memory device shown in FIG. 3.

FIG. 11 shows an example of the construction of the sense amplifiers SA-1 to SA-M used here. It comprises p-channel MOS transistors 300 and 301 each having a source connected to a power supply terminal $V_D$, n-channel MOS transistors 302 and 303, which have their drains respectively connected to the drains of the MOS transistors 300 and 301 and their sources connected to each other, and n-channel MOS transistors 304 and 305 connected in series between the source of the MOS transistors 302 and 303 and a power supply terminal $V_S$.

The MOS transistors 300 and 302 have their gates connected to each other and also connected to the drains of the MOS transistors 301 and 303 and to the data line D0. The MOS transistors 301 and 303 have their gates connected to each other and also connected to the drains of the MOS transistors 300 and 302 and to the data line D1. The MOS transistor 304 has its gate connected to a column selection terminal CT which is connected to a column selection line connected to the column decoder 4 (which is omitted in FIG. 3 for clarifying the drawing), and the MOS transistor 305 has its gate connected to a clock pulse reception terminal PT for receiving the clock pulse output of the clock pulse generator 22.

The operation of the sense amplifier shown in FIG. 11 will now be described in connection with the case when the memory cell MC-M1 is selected at the time of the readout operation. In this case, the word line W1 is energized by a row selection signal from the row decoder 2, thus causing data to be read out from the memory cell MC-M1 to the data lines D0-M and D1-M. At the same time, a column selection signal from the column decoder 4 is impressed upon the gate of the MOS transistor 304 to render this MOS transistor conductive. The clock pulse generator 22 supplies a clock pulse to the gate of the MOS transistor 305 at an instant when the potential difference between the data lines D0-M and D1-M in the neighborhood of this sense amplifier reaches such as a level that can be sensed by the sense amplifier, thus rendering the MOS transistor 305 conductive. As a result, if the potential on the data line D0-M is higher than the potential on the data line D1-M, the MOS transistors 301 and 302 are rendered conductive while the MOS transistors 300 and 303 are rendered non-conductive. In consequence, the potential on the data line D0-M is raised to a higher level because the supply voltage $V_D$ is superimposed through the MOS transistor 301 in conduction, while the potential on the data line D1-M is lowered toward the reference potential level through the MOS transistors 302, 304 and 305 in conduction. In this way, the potential difference between the data lines D0-M and D1-M is quickly expanded.

As mentioned earlier, there exists a parasitic capacitance between each of the word lines W1 to WN and the MOS transistors used in each of the memory cells as shown in FIGS. 4 or 5 because of the fact that each word line is connected to the gates of two of the MOS transistors constituting each memory cell. This parasitic capacitance produces a delay time from the appearance of the row selection signal from the row decoder 2 till the energization of one of the memory cells MC-M1 to MC-MN (the delay time corresponding to a time constant $\tau_p = C_p R_p$ where $C_p$ is the total parasitic capacitance for the word line and $R_p$ is the resistance thereof). In view of this fact, the dummy capacitors C1 to CM are connected to the dummy word line WD. These dummy capacitors C1 to CM may, for instance, be CMOS capacitors. Also, they have a total capacitance $C_D$ practically corresponding to the total parasitic capacitance $C_p$ existing between, for instance, the word line W1 and memory cells MC-11 to MC-M1, i.e., satisfying $Z_p = Z_D = C_D R_D$ ($R_D$ is the resistance of the word line). This means that according to this embodiment the time elapsed until one of the memory cells MC-M1 to MC-MN is energized by the row selection signal from the row decoder 20 is substantially equal to the time until the dummy selection signal from the dummy decoder 200 is impressed as energizing signal upon the clock pulse generator 22. It is to be noted that the time required from the reception of the energizing signal by the clock pulse generator 22 till the generation of a clock pulse therefrom is not longer than the time required until data read out from, for instance, the memory cell MC-MN is supplied as effective data to the sense amplifier SA-M. In practice, therefore, in order to realize the optimum timing of energization of the sense amplifiers SA-1 to SA-N, it is convenient to form the capacitors C1 to CM in such a manner that a capacitance lower than the total parasitic capacitance coupled to each of the word lines W1 to WN is coupled to the dummy word line WD so that the clock pulse generator 22 may be energized by the dummy selection signal from the dummy decoder 20 before any one of the memory cells MC-M1 to MC-MN is energized by the row selection signal from the row decoder 2. To this end, it is possible, for instance, to make the dummy word line WD narrower than the word lines W1 to WN or omit one or more of the capacitors C1 to CM. Further, similar effects may be obtained by forming the dummy word line WD thicker and thus reducing the resistance $R_D$.

Further, it is advantageous to form the output line from the clock pulse generator 22 with a metal so that the sense amplifiers SA-1 to SA-M may be energized by a clock pulse from the clock pulse generator 22 practically at the same timing.

As has been shown, it is possible to realize the optimum timing of activation of the sense amplifiers SA-1 to SA-M by constructing the row decoder 2, individual decoder sections and clock pulse generator 10 to have substantially the same construction and determining the time constant $\tau_D$ of the dummy word line WD from the considerations of the time required for the clock pulse generator 22 to become operative and the time constant $\tau_p$ of the word lines W1 to WN. In this case, since the dummy word line WD and word lines W1 to WN are arranged substantially under the same conditions, they are influenced by the changes of ambient conditions such as ambient temperature in the same way, that is, the time constant $\tau_D$ for the dummy word line WD and the time constant $\tau_p$ for each of the word lines W1 to WN change in a predetermined relation to each other so that the optimum timing of activation of the sense amplifiers SA-1 to SA-M can be maintained.

Figure 12:
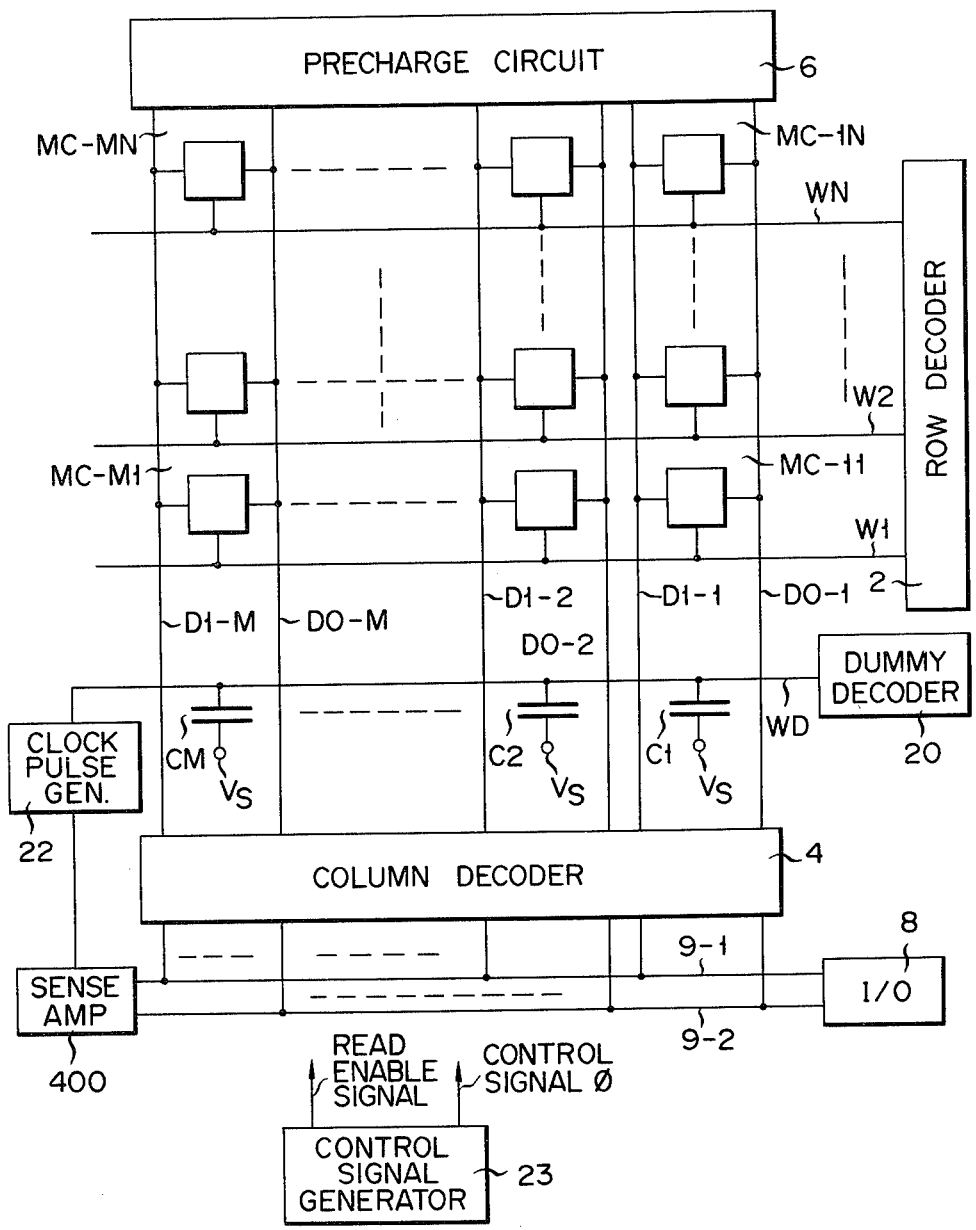
FIG. 12 is a block diagram showing a different embodiment of the semiconductor memory device according to the invention.

FIG. 12 shows a second embodiment of the semiconductor memory circuit according to the invention. This semiconductor memory circuit differs from that of FIG. 1 only in that in this circuit a sense amplifier 400 having output lines connected to a pair of input/output lines 9-1 and 9-2 of the input/output unit 8 is used in lieu of the sense amplifiers SA-1 to SA-M.

Figure 13:
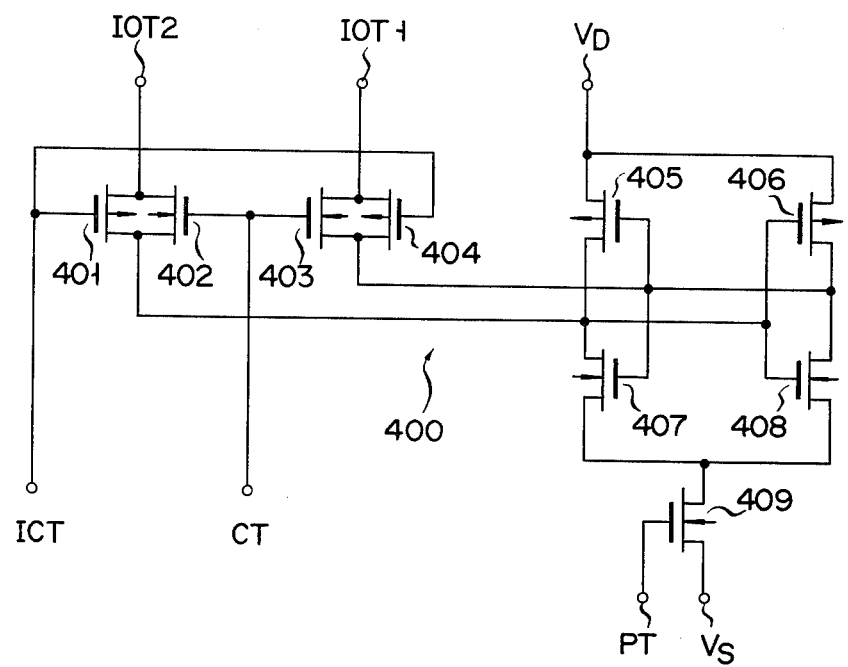
FIG. 13 is a circuit diagram showing an example of the sense amplifier used for the semiconductor memory device shown in FIG. 10.

FIG. 13 shows an example of the sense amplifier 100 used in the semiconductor memory circuit shown in FIG. 10. It comprises p- and n-channel MOS transistors 401 and 402 with the current paths connected in parallel with each other, p- and n-channel MOS transistors 403 and 404 with the current paths connected in parallel with each other, p-channel MOS transistors 405 and 406 with the sources connected to a power supply terminal $V_D$, n-channel MOS transistors 407 and 408 with the drains respectively connected to the drains of the MOS transistors 405 and 406, and an n-channel MOS transistor 409 having the drain connected to the sources of the MOS transistors 407 and 408 and the source connected to a power supply terminal $V_S$.

The MOS transistors 402 and 403 have their gates commonly connected to a column selection terminal CT which is connected to column selection lines of the column decoder 4 (which are not shown in FIG. 12 for clarifying the drawing), and the MOS transistors 401 and 404 have their gates commonly connected to a terminal ICT for receiving a selection signal, the terminals CT and ICT being connected to receive selection signals in an inverted relation to each other. The MOS transistors 405 and 407 have their gates commonly connected to the drains of the MOS transistors 406 and 408 and also connected through the MOS transistors 403 and 404 to an input/output terminal IOT1 which is connected to the input/output line 9-2. The MOS transistors 406 and 408 have their gates commonly connected to the drains of the MOS transistors 405 and 407 and also connected to an input/output terminal IOT2 which is connected to the input/output line 9-1. The MOS transistor 409 has its gate connected to a clock pulse reception terminal PT which is connected to the output terminal of the clock pulse generator 22.

The operation of the sense amplifier 400 shown in FIG. 13 will now be described in connection with the case when the memory cell MC-M1 is selected at the time of the readout operation. In this case, the word line W1 is energized by a row selection signal from the row decoder 2, thus causing data to be read out from the memory cell MC-M1 to the data lines D0-M and D1-M. At the same time, a column selection signal from the column decoder 4 is impressed upon the gates of the MOS transistors 402 and 403, so that an inversion signal obtained from the column selection signal is impressed upon the gates of the MOS transistors 401 and 404. As a result, the MOS transistors 401 and 404 are rendered conductive, whereby the data read out from the memory cell MC-M1 is transferred through the MOS transistors 401 to 404. It is assumed that high and low level data signals are impressed upon the respective terminals IOT1 and IOT2. When the difference between both the data signal levels is increased to such a level that can be sensed by the sense amplifier 400, a pulse is produced from the clock pulse generator 22 and impressed upon the gate of the MOS transistor 409 to turn this MOS transistor conductive, thus rendering the MOS transistors 406 and 407 conductive. In consequence, the potential at the terminal IOT1 is raised in level by means of the high level voltage supplied to the power supply terminal $V_D$, while the potential at the terminal IOT2 is lowered in level by means of the low level voltage applied to the reference voltage terminal $V_S$. In this way, the potential difference between the data lines D0-M and D1-M is quickly expanded.

Figure 14:
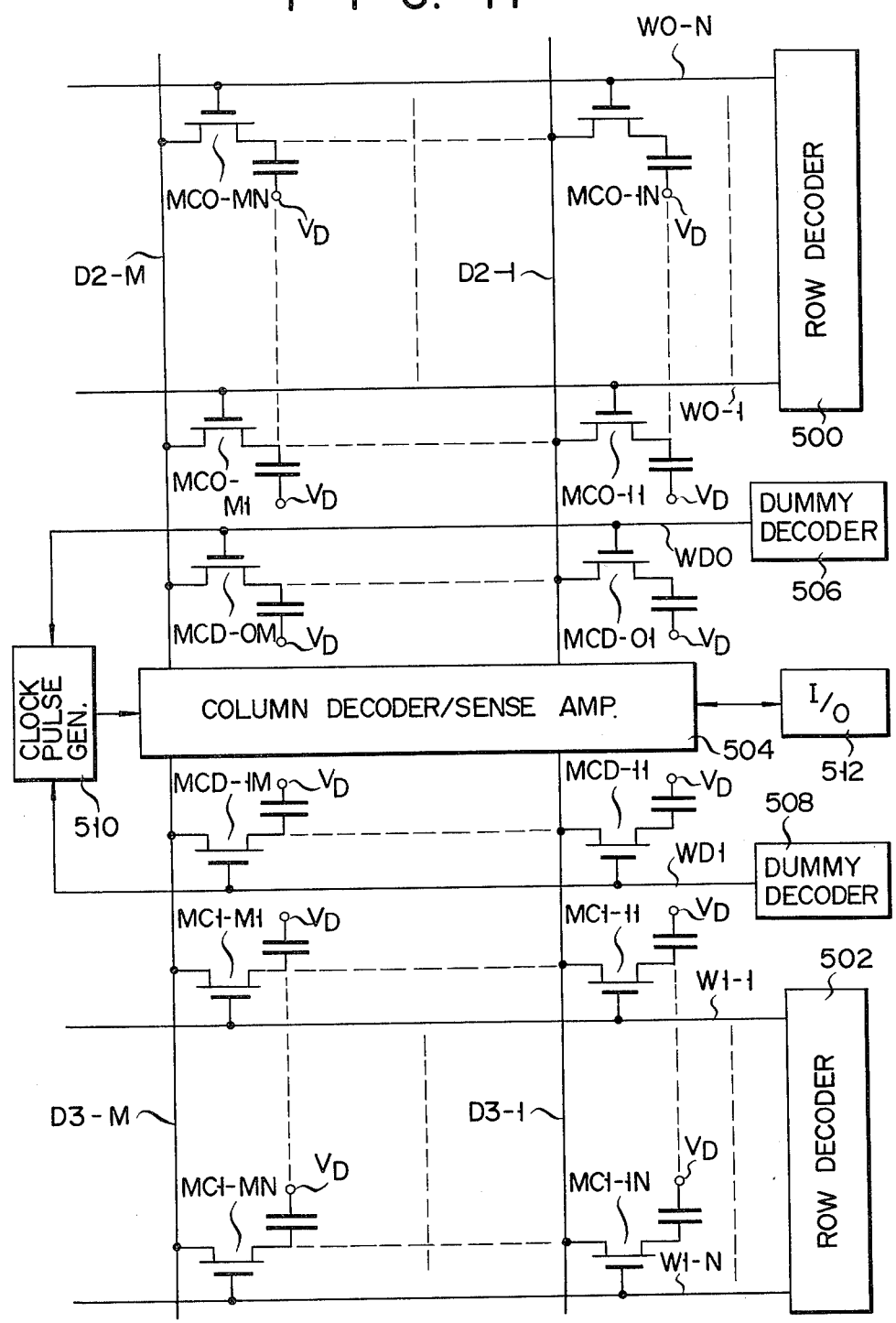
FIG. 14 is a block diagram showing a further embodiment of the invention applied to a dynamic random access memory.

FIG. 14 shows a further embodiment of the invention applied to a dynamic random access memory (DRAM). This DRAM comprises a first matrix array of memory cells MCO-11 to MCO-MN, a second matrix array of memory cells MC1-11 to MC1-MN, word lines W0-1 to W0-N and data lines D2-1 to D2-M coupled to the dynamic memory cells MC0-11 to MC0-MN and word lines W1-1 to W1-N and data lines D3-1 to D3-M. The word lines W0-1 to W0-N are connected to a row decoder 500, which is connected to an address signal generator (not shown) and functions to selectively energize one of the word lines W0-1 to W0-N in response to an address signal from the address signal generator. The word lines W1-1 to W1-N are connected to a row decoder 502 for selectively energizing one of them in response to an address signal. The data lines D2-1 to D2-M and D3-1 to D3-M are connected to a column decoder/sense amplifier 504 for selecting one of the data lines D2-1 to D2-M and corresponding one of the data lines D3-1 to D3-M.

This DRAM further comprises a dummy word line WD0 arranged in the same way as the word lines W0-1 to W0-N, dummy memory cells MCD-01 to MCD-0M commonly connected to the dummy word line WD0 and also connected to the respective data lines D2-1 to D2-M, a dummy word line WD1 arranged in the same way as the word lines W1-1 to W1-N, and dummy memory cells MCD-11 to MCD-1M commonly connected to the dummy word line WD1 and also connected to the respective data lines D2-1 and D3-M. The dummy word lines WD0 and WD1 are connected to respective dummy decoders 506 and 508. The dummy decoder 506 produces a dummy selection signal when one of the word lines W1-1 to W1-N is energized by the row decoder 502, for instance, in response to an address signal, and the dummy decoder 508 produces a dummy selection signal when one of the word lines W0-1 to W0-N is energized. In other words, at the time of the address designating operation either dummy word line WD0 or WD1 is energized. The DRAM further comprises a clock pulse generator 510 and a sense amplifier circuit 504. The clock pulse generator 510 is connected to the dummy decoders 506 and 508, and it supplies a clock pulse to the sense amplifier circuit 504 for activating this circuit in response to a dummy selection signal supplied to the same through the dummy word line WD0 or WD1.

In this DRAM, capacitors used for the memory cells MC0-11 to MC0-MN and MC1-11 to MC1-MN have double the capacitance of capacitors used for the dummy memory cells MCD-01 to MCD-0M and MCD-11 to MCD-1M.

The operation of this DRAM will now be described in connection with the case of reading out data from, for instance, the memory cell MC0-M1. The word line W0-1 is energized by the row decoder 500 at the same timing as that at which the dummy word line WD1 is energized by the dummy decoder 508 as in the previous embodiments. Thus, the memory cells MC0-M1 and MCD-1M are substantially simultaneously rendered conductive. As a result, a data signal of 0 level or $V_L$ level is read out from the memory cell MC0-M1 and transferred through the data line D2-M to the sense amplifier 504. Meanwhile, a dummy data signal having a level of $\frac{1}{2} V_L$ is transferred from the dummy memory cell MCD-1M to the sense amplifier 504. The sense amplifier 504 detects the difference voltage between the data signals from the memory cells MC0-M1 and MCD-1M, whereupon a corresponding data is transferred through an input/output unit 512 to an external circuit (not shown).

With the DRAM of FIG. 14, it is also possible to adjust the timing of activating the sense amplifier 504 with a clock pulse from the clock pulse generator 510 by forming the dummy word lines WD0 and WD1 such that they have a different thickness or width from that of the word lines W0-1 to W0-N. Also, with this DRAM, like the previous embodiments, the dummy word lines WD0 and WD1 are arranged substantially in the same way as the word lines W0-1 to W0-N and W1-1 to W1-N, so that it is possible to maintain the optimum timing of activation of the sense amplifier 504 irrespective of the changes of ambient conditions.

While some preferred embodiments of the invention have been described in the foregoing, they are by no means limiting, and various changes and modifications can be made without departing from the scope and spirit of the invention.

What is claimed is:

1. A semiconductor memory device comprising:
   a plurality of semiconductor memory cells;
   at least one word line coupled to said plurality of semiconductor memory cells for selectively transmitting an access signal thereto;

at least one pair of data lines coupled to said plurality of semiconductor memory cells for transferring data with respect thereto;

sense amplifier means coupled to said at least one pair of data lines for amplifying a data signal transferred therethrough;

a dummy word line having a signal transfer property corresponding to that of said at least one word line;

a dummy selection signal generating means coupled to said dummy word line for supplying a dummy selection signal to said dummy word line every time an addressing operation is effected; and energizing signal generating means coupled to said dummy word line for generating a first energizing signal for a preset period of time in each operation cycle to activate said sense amplifier means in response to a dummy selection signal transmitted through said dummy word line.

2. A semiconductor memory device according to claim 1, wherein said energizing signal generating means is connected to produce a second energizing signal for a preset period of time to activate said sense amplifier means in response to the trailing edge of a write-in mode setting signal which is generated after said first energizing signal in a write-in operation cycle.

3. A semiconductor memory device according to claim 1, which further comprises capacitive means coupled to said dummy word line.

4. A semiconductor memory device according to claim 3, wherein said capacitive means includes at least one MOS capacitor.

5. A semiconductor memory device according to claim 1, 2 or 3, which further comprises a column decoder for selectively energizing said at least one pair of data lines, and a pair of input/output lines coupled to said at least one pair of data lines through said column decoder.

6. A semiconductor memory device according to claim 5, wherein said sense amplifier means includes a sense amplifier having an input/output terminal coupled to said input/output lines for amplifying a data signal on said input/output lines in response to an output signal from said energizing signal generating means.

7. A semiconductor memory device according to claim 1, 2 or 3, which further comprises a means coupled to said at least one pair of data lines for setting said data lines to an equal potential level every time when an address designating operation is effected.

8. A semiconductor memory device according to claim 1, 2 or 3, wherein said sense amplifier means includes at least one sense amplifier having input/output terminals coupled to said at least one pair of data lines for amplifying a data signal on said at least one pair of data lines in response to an output signal from said energizing signal generating means.

9. A semiconductor memory device according to claim 1, 2 or 3, wherein said dummy word line is made of substantially the same semiconductor material as that of said at least one word line.

10. A semiconductor memory device according to claim 1, 2 or 3, which further comprises decoding means for selectively energizing said at least one word line, said decoding means and said dummy selection signal generating means having approximately the same response time characteristic.

11. A semiconductor memory device comprising:
a plurality of semiconductor memory cells arranged in a matrix array;

a plurality of word lines each commonly coupled to the semiconductor memory cells on the same row;

a plurality of pairs of data lines each pair commonly coupled to the semiconductor memory cells on the same column for the transfer of data with respect to these memory cells;

sense amplifier means coupled to said plurality of pairs of data lines for amplifying data transferred through one of said data line pairs;

a dummy word line having a signal transfer property corresponding to those of said word lines;

dummy selection signal generating means coupled to said dummy word line for supplying a dummy selection signal to said dummy word line every time an address designating operation is effected; and energizing signal generating means, coupled to said dummy word line for producing a first energizing signal for a preset period of time in each operation cycle to activate said sense amplifier means in response to a dummy selection signal transmitted through said dummy word line.

12. A semiconductor memory device according to claim 11, wherein said energizing signal generating means is connected to produce a second energizing for a preset period of time to activate said sense amplifier means in response to the trailing edge of a write-in mode setting signal which is generated after said first energizing signal in a write-in operation cycle.

13. A semiconductor memory device according to claim 11, which further comprises capacitive means coupled to said dummy word line.

14. A semiconductor memory device according to claim 13, wherein said capacitive means includes at least one MOS capacitor.

15. A semiconductor memory device according to claim 11, 12 or 13, which further comprises decoding means for selectively energizing said plurality of pairs of data lines and a pair of input/output lines coupled to said plurality of pairs of data lines through said decoding means.

16. A semiconductor memory device according to claim 15, wherein said sense amplifier means includes a sense amplifier having input/output terminals coupled to said pair of input/output lines for amplifying a data signal on said input/output lines in response to an output signal from said energizing signal generating means.

17. A semiconductor memory device according to claim 11, 12 or 13, which further comprises means coupled to said plurality of pairs of data lines for setting said data lines to an equal potential level every time when an address specifying operation is effected.

18. A semiconductor memory device according to claim 11, 12 or 13, wherein said sense amplifier means includes a plurality of sense amplifiers each having input/output terminals coupled to said plurality of pairs of data lines for amplifying a data signal on the corresponding pair of data lines in response to an output signal from said energizing signal generating means.

19. A semiconductor memory device according to claim 11, 12 or 13, wherein said dummy word line is made of substantially the same semiconductor material as said word lines.

20. A semiconductor memory device according to claim 11, 12 or 13, wherein said dummy word line extends substantially parallel to said word lines.

21. A semiconductor memory device according to claim 11, 12 or 13, which further comprises a decoding means for selectively energizing said plurality of word lines, said decoding means and said dummy selection signal generating means having approximately the same response time characteristics.

22. A semiconductor memory device comprising:
a plurality of semiconductor memory cells arranged in a matrix array;
a plurality of word lines each commonly coupled to the semiconductor memory cells in each row of said matrix array;
a plurality of data lines each commonly coupled to the semiconductor memory cells in each column of said matrix array for the transfer of data with respect to these memory cells;
a sense amplifier means coupled to said plurality of data lines for amplifying data transferred through one of said data lines;
a dummy word line having a signal transfer property corresponding to those of said word lines;
a dummy selection signal generating means coupled to said dummy word line for supplying a dummy selection signal to said dummy word line every time an address designating operation is effected; and
energizing signal generating means coupled to said dummy word line for producing a first energizing signal for a preset period of time in each operation cycle to activate said sense amplifier in response to a dummy selection signal transmitted through said dummy word line.

23. A semiconductor memory device according to claim 22, wherein said energizing signal generating means is connected to produce a second energizing for a preset period of time to activate said sense amplifier means in response to the trailing edge of a write-in mode setting signal which is generated after said first energizing signal in a write-in operation cycle.

24. A semiconductor memory device according to claim 22, which further comprises at least one dummy data line coupled to said sense amplifier means and at least one dummy memory cell coupled to said at least one dummy word line for supplying a dummy data to said dummy data line in response to a first energizing signal supplied from said energizing signal generating means through said dummy word line.

25. A semiconductor memory device according to claim 22, 23 or 24, wherein said dummy word line is made practically of the same semiconductor material as that of said word lines.

26. A semiconductor memory device according to claim 22, 23 or 24, wherein said dummy word line extends substantially parallel to said word lines.

27. A semiconductor memory device according to claim 22, 23 or 24, which further comprises decoding means for selectively energizing said plurality of word lines, said decoding means and said dummy selection signal generating means having practically the same response time characteristics.

* * * * *